US012531551B2

(12) United States Patent
Yan et al.

(10) Patent No.: US 12,531,551 B2
(45) Date of Patent: *Jan. 20, 2026

(54) DELAY CIRCUIT, PULSE GENERATION CIRCUIT, CHIP AND SERVER (71) Applicant: BITMAIN TECHNOLOGIES INC., Beijing (CN)

(72) Inventors: Hao Yan, Beijing (CN); Benfu Wei, Beijing (CN); An Zhao, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 94 days.

This patent is subject to a terminal disclaimer.

(21) Appl. No.: 18/571,130

(22) PCT Filed: May 12, 2022

(86) PCT No.: PCT/CN2022/092562
§ 371 (c)(1),
(2) Date: Dec. 15, 2023

(87) PCT Pub. No.: WO2022/237886
PCT Pub. Date: Nov. 17, 2022

(65) Prior Publication Data
US 2024/0213969 A1 Jun. 27, 2024

(30) Foreign Application Priority Data
May 14, 2021 (CN) .......................... 202110529236.4

(51) Int. Cl.
H03K 5/134 (2014.01)
H03K 3/037 (2006.01)
(Continued)

(52) U.S. Cl.
CPC .............. *H03K 5/134* (2014.07); *H03K 3/037* (2013.01); *H03K 2005/00019* (2013.01); *H03K 2005/00286* (2013.01); *H03K 17/6872* (2013.01)

(58) Field of Classification Search
CPC .... H03K 5/134; H03K 3/037; H03K 17/6872; H03K 2005/00019; H03K 2005/00286; H03K 3/02; H03K 17/28
See application file for complete search history.

(56) References Cited

U.S. PATENT DOCUMENTS 6,255,879 B1 * 7/2001 Voss ....................... H03K 5/133
327/276
7,629,856 B2 12/2009 Thaller
(Continued)

FOREIGN PATENT DOCUMENTS

CN 1860686 A 11/2006
CN 101174825 A 5/2008
(Continued)

OTHER PUBLICATIONS

Issue a patent for an invention dated Jun. 3, 2024 for Russian Application No. 2023133102/07(073135).
(Continued)

*Primary Examiner* — Lincoln D Donovan
*Assistant Examiner* — Amit R Bhatia (57) ABSTRACT A delay circuit, a pulse generation circuit, a chip, and a server is disclosed. The delay circuit includes a control unit and at least two delay sub-circuits. Input ends of the delay sub-circuits are connected to each other. Output ends of the delay sub-circuits are connected to each other. The output end of each delay sub-circuit is connected to an input end of an adjacent delay sub-circuit through a switch unit. Each delay sub-circuit includes a delay unit and a switch unit. The delay unit is configured to perform delay processing on an
(Continued)

input pulse signal. The switch unit is configured to control the delay sub-circuit to or not to be connected. The control unit is connected to all the switch units, and is configured to separately control a plurality of switch units to be turned on or off, so as to perform corresponding delay processing on the pulse signal.

8 Claims, 4 Drawing Sheets

(51) Int. Cl.
*H03K 5/00* (2006.01)
*H03K 17/687* (2006.01)

(56) References Cited

U.S. PATENT DOCUMENTS

| | | | |
|---|---|---|---|
| 2012/0307405 A1* | 12/2012 | Chen | H02H 9/046 361/56 |
| 2013/0002329 A1 | 1/2013 | Murofushi et al. | |
| 2016/0079971 A1* | 3/2016 | Singh | G11C 29/028 327/276 |

FOREIGN PATENT DOCUMENTS

| | | |
|---|---|---|
| CN | 102771049 A | 11/2012 |
| CN | 203151467 U | 8/2013 |
| CN | 106716537 A | 5/2017 |
| CN | 107592099 A | 1/2018 |
| CN | 108449078 A | 8/2018 |
| CN | 111490758 A | 8/2020 |
| RU | 2386208 C1 | 4/2010 |
| WO | WO2016043844 A1 | 3/2016 |

OTHER PUBLICATIONS

International Search Report dated Jul. 20, 2022 regarding International Application No. PCT/CN2022/092562.
Extended European Search Report dated Oct. 15, 2024 for Application No. 22806848.2.
First Office Action for Chinese Patent Application No. 202110529236.4, dated Jul. 2, 2025.

* cited by examiner

FIG. 1

(Prior Art)

DELAY CIRCUIT, PULSE GENERATION CIRCUIT, CHIP AND SERVER

CROSS-REFERENCE TO RELATED APPLICATION

The present application is a national stage of International Application No. PCT/CN2022/092562, filed on May 12, 2022, which claims priority to Chinese Patent Application No. 202110529236.4, filed with the China National Intellectual Property Administration on May 14, 2021 and entitled "DELAY CIRCUIT, PULSE GENERATION CIRCUIT, CHIP, AND SERVER", both of the above applications are incorporated herein by reference in their entireties.

TECHNICAL FIELD

The present disclosure relates to the field of integrated circuit technologies, and in particular, to a delay circuit, a pulse generation circuit, a chip, and a server.

BACKGROUND

A delay circuit is usually used in an integrated circuit design. The delay circuit may be configured for delaying a signal, removing a jitter of a signal, generating a signal, and the like.

An electronic apparatus, for example, a computer, a mobile phone, or a storage apparatus, may include an integrated circuit having various components or circuits integrated therein. Each integrated circuit may be coupled to one or more external circuits or apparatuses, and includes assemblies configured to be connected to the external circuits or apparatuses through interfaces. For example, a peripheral apparatus like the storage apparatus may be coupled to a storage controller. Generally, the storage apparatus and the storage controller may differ in operation speeds. Therefore, the integrated circuit needs a delay circuit configured to adjust signal timing between the storage apparatus and the storage controller.

To implement different delay processing on a signal in different cases, a plurality of signal output ports may be provided on a single delay chain, and distances between the output ports and an input port of the delay chain are inconsistent. Therefore, the signal may be controlled to be output from different output ports, to control delays in delay processing on the signal.

SUMMARY

A main objective of the present disclosure is to provide a delay circuit, a pulse generation circuit, a chip, and a server.

According to a first aspect, an embodiment of the present disclosure provides a delay circuit, including a control unit and at least two delay sub-circuits. Input ends of the delay sub-circuits are connected to each other, and are configured to receive a pulse signal. Output ends of the delay sub-circuits are connected to each other, and are configured to output a delayed pulse signal. The output end of each delay sub-circuit is connected to an input end of an adjacent delay sub-circuit through a switch unit. Each delay sub-circuit includes a delay unit and a switch unit. The delay unit is configured to perform delay processing on the input pulse signal. The switch unit is configured to control the delay sub-circuit to or not to be connected. The control unit is connected to all the switch units, and is configured to separately control a plurality of switch units to be turned on or off, so as to perform corresponding delay processing on the pulse signal.

In some implementations, the delay sub-circuits include a first delay circuit and a second delay circuit. The first delay circuit includes a first delay unit and a first switch unit. The second delay circuit includes a second delay unit and a second switch unit. An output end of the first delay unit is connected to a first end of the first switch unit. An input end of the first delay unit is connected to a first end of the second switch unit. An input end of the second delay unit is connected to a second end of the second switch unit. An output end of the second delay unit is connected to a second end of the first switch unit. A first end of a third switch unit is connected to the output end of the first delay unit. A second end of the third switch unit is connected to the input end of the second delay unit. The control unit is connected to the first switch unit, the second switch unit, and the third switch unit, and is configured to control the first switch unit, the second switch unit, and the third switch unit to be turned on or off, so as to perform corresponding delay processing on the pulse signal.

In some implementations, controlling the first switch unit, the second switch unit, and the third switch unit to be turned on or off, so as to perform corresponding delay processing on the pulse signal includes: sending, by the control unit, a corresponding control signal to the first switch unit, the second switch unit, and the third switch unit. When the control signal is for controlling the first switch unit and the second switch unit to be turned off and controlling the third switch unit to be turned on, the first delay unit is connected to the second delay unit in series, and the input pulse signal sequentially passes through the first delay unit and the second delay unit, so that a pulse signal delayed for a first delay time is output: or when the control signal is for controlling the first switch unit and the second switch unit to be turned on and controlling the third switch unit to be turned off, the first delay unit is connected to the second delay unit in parallel, and the input pulse signal simultaneously passes through the first delay unit and the second delay unit, so that a pulse signal delayed for a second delay time is output. The first delay time is greater than the second delay time.

In some implementations, the first delay unit and the second delay unit each include a plurality of phase inverters connected in series. Numbers of phase inverters included in the first delay unit and the second delay unit are equal and both even.

In some implementations, the phase inverter includes a PMOS (Positive channel Metal Oxide Semiconductor) transistor and an NMOS (Negative channel-Metal-Oxide-Semiconductor) transistor. A source of the PMOS transistor is connected to a power supply. A gate of the PMOS transistor and a gate of the NMOS transistor are connected, to act as an input end. A drain of the PMOS transistor and a drain of the NMOS transistor are connected, to act as an output end. A source of the NMOS transistor is connected to a ground terminal.

In some implementations, the first switch unit, the second switch unit, and the third switch unit each include a third end and a fourth end. Both the third end and the fourth end are connected to the control unit, and are configured to receive a control signal transmitted by the control unit, to control statuses of the first switch unit, the second switch unit, and the third switch unit based on the control signal, so that the delay circuit outputs a pulse signal delayed for a corresponding delay time.

According to a second aspect, an embodiment of the present disclosure provides a pulse generation circuit, including a flip-flop and a delay circuit. An input end of the flip-flop is connected to a signal source, and an output end of the flip-flop is connected to an input end of the delay circuit. The flip-flop is configured to output a corresponding pulse signal based on a signal sent by the signal source. The delay circuit is as described in the foregoing implementations.

In some implementations, the flip-flop is a D flip-flop (Data flip-flop, abbreviated as DFF). A signal input end of the D flip-flop is connected to the signal source. A clock input end of the D flip-flop is configured to receive a clock pulse. A signal output end and a clear signal end of the D flip-flop are connected to the input end of the delay circuit.

According to a third aspect, an embodiment of the present disclosure provides a chip. The chip is integrated with the pulse generation circuit as described in the foregoing implementations.

According to a fourth aspect, an embodiment of the present disclosure provides a server, including a plurality of chips as described in the foregoing implementations.

The input ends of the delay sub-circuits are connected to each other, and the output ends are connected to each other. The output ends of the delay sub-circuits are connected to the input ends of the adjacent delay sub-circuits through the switch units. Each delay sub-circuit is provided with the switch unit. In this way, the control unit controls turning-on or turning-off of the switch units to further control the delay sub-circuits to perform corresponding delay processing on the input pulse signal. Therefore, a delay time of the delay circuit can be controlled. In addition, when the pulse signal is processed based on a short delay, the delay sub-circuits are set to be connected in parallel. In this way, when processing is performed based on the short delay, a driving capability of the delay circuit is improved through parallel connection between delay chains, so that a process fluctuation of the delay chains is reduced, and appropriate resource utilization effect is achieved.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show some embodiments of the present application, and those of ordinary skill in the art may derive other drawings from these accompanying drawings without creative efforts.

DESCRIPTION OF EMBODIMENTS

The technical solutions in the embodiments of the present disclosure will be clearly and completely described below in conjunction with the accompanying drawings in the embodiments of the present disclosure. Apparently, the embodiments described are some rather than all of the embodiments of the present disclosure. On the basis of the embodiments of the present disclosure, all other embodiments obtained by those of ordinary skill in the art without involving any inventive effort fall within the scope of protection of the present disclosure.

The diagrams shown in the accompanying drawings are merely examples for description, but do not necessarily include all content or operations/steps, and the operations/steps are not necessarily performed in the order described. For example, some operations/steps may alternatively be split, combined, or partially combined, and therefore an actual order of execution may change depending on an actual situation.

It should be understood that terms used in this specification of the present disclosure are only for the purpose of describing specific embodiments, and are not intended to limit the present disclosure.

Figure 1:
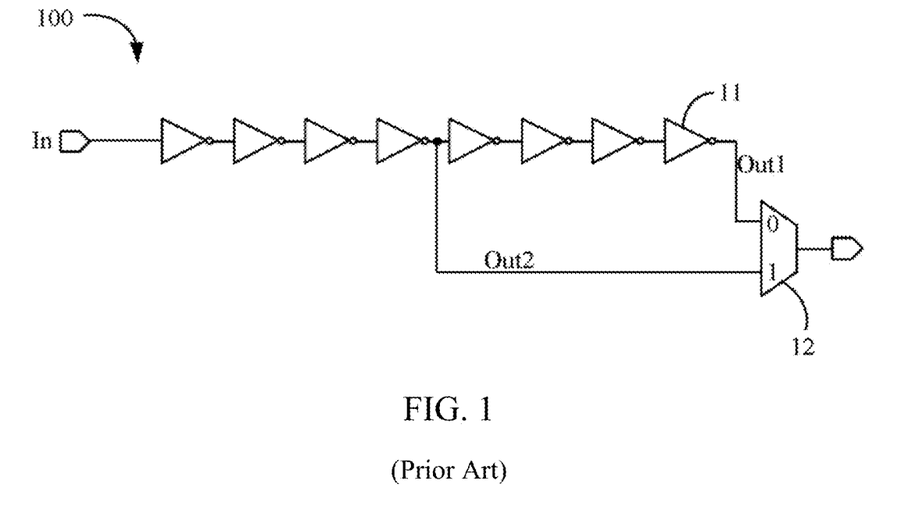
FIG. 1 is a schematic diagram of a structure of a delay circuit in an existing solution.

Refer to FIG. 1. In the related art, a delay chain 100 includes a plurality of phase inverters 11 connected in series. A selector 12 is connected to an output end of a phase inverter chain. A pulse signal input from an input port In is delayed by using the disposed phase inverter chain, and a corresponding pulse signal is output by using the selector 12. The phase inverter chain is provided with a plurality of output ports, so as to make a delay adjustable.

For example, as shown in FIG. 1, the phase inverter chain includes eight phase inverters 11 connected in series. A first output port Out1 is disposed at a tail end of the phase inverter chain. A second output port Out2 is disposed at a middle end of the phase inverter chain. When the pulse signal is controlled to be output from the first output port Out1, the phase inverter chain performs first delay processing on the pulse signal: or when the pulse signal is controlled to be output from the second output port Out2, the phase inverter chain performs second delay processing on the pulse signal. It is clear that the pulse signal output from the first output port Out1 passes through eight phase inverters, and the pulse signal output from the second output port Out2 passes through four phase inverters. Therefore, a first delay is greater than a second delay.

The output ports are provided at different positions on the phase inverter chain to control the pulse signal to be output from different ports, so as to perform different delay processing on the pulse signal. However, in the foregoing manner, although the delay is adjustable, when a short delay is implemented, a subsequent redundant part of the phase inverter chain is not correspondingly used, which causes resource waste.

Therefore, the present disclosure provides a delay circuit, a pulse generation circuit, a chip, and a server, to solve the foregoing problem.

Some embodiments of the present disclosure will be described in detail below with reference to the accompanying drawings. The following embodiments and features in the embodiments may be mutually combined in case of no conflict.

Figure 2:
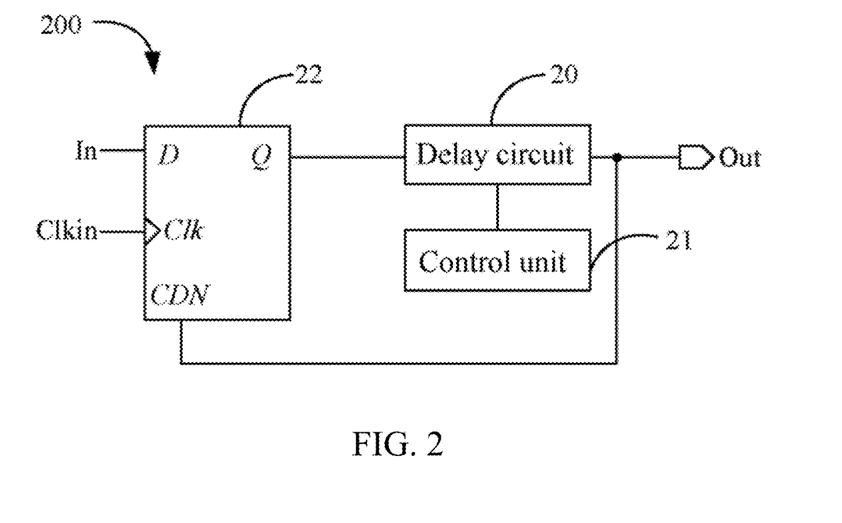
FIG. 2 is a schematic diagram of a structure of a pulse circuit according to an embodiment of the present disclosure.

Refer to FIG. 2. The present disclosure provides a pulse generation circuit 200, including a flip-flop 22 and a delay circuit 20. The flip-flop 22 uses a clock pulse Clkin as a control signal, and changes an output status based on the control signal. The delay circuit 20 is configured to perform delay processing on a signal output by the flip-flop 22. The delay circuit 20 is connected to a control unit 21, and is configured to receive a control signal sent by the control unit 21.

Specifically, the flip-flop 22 is a D flip-flop. The D flip-flop includes a signal input end D, a clock input end Clk, a signal output end Q, and a clear signal end CDN. The signal input end D is connected to a signal source. The clock input end Clk is configured to receive the clock pulse Clkin. The signal output end Q is connected to an input end of the delay circuit 20. The clear signal end CDN is connected to an output end of the delay circuit 20. When the clock pulse Clkin received by the clock input end Clk is at a high level, the D flip-flop reads data of the signal input end D, and transmits the data to the signal output end Q: or when the clock pulse Clkin received by the clock input end Clk is at a low level, the D flip-flop shields data of the signal input end D, and outputs current data to the signal output end Q only when a next high level arrives.

The delay circuit 20 receives a pulse signal output by the flip-flop 22, and performs corresponding delay processing based on the control signal sent by the control unit 21, so as to output a pulse signal obtained after delay processing.

Figure 3:
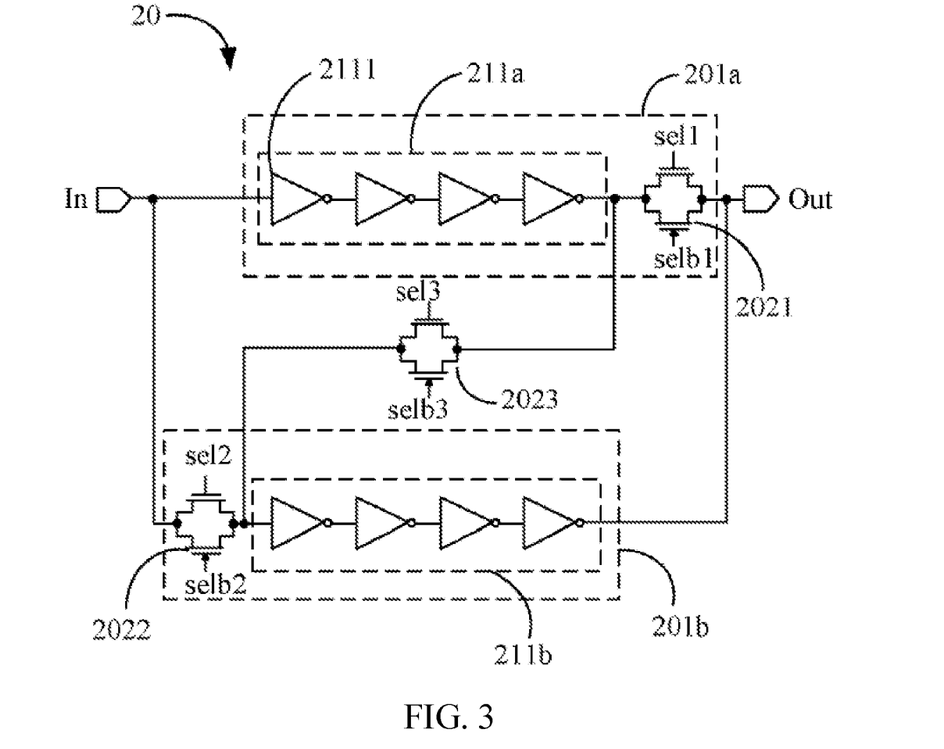
FIG. 3 is a schematic diagram of a structure of a delay circuit according to an embodiment of the present disclosure.

Refer to FIG. 2 and FIG. 3. In some implementations, an example in which the delay circuit 20 includes two delay sub-circuits is used for description.

Specifically, the delay circuit 20 includes a first delay circuit 201a, a second delay circuit 201b, and the control unit 21. The first delay circuit 201a is connected to the second delay circuit 201b through a switch module. The switch module includes a first switch unit 2021, a second switch unit 2022, and a third switch unit 2023. The switch module is connected to the control unit 21, so as to receive the control signal sent by the control unit 21, and determine, based on the control signal, whether to be turned on to cause the first delay circuit 201a and the second delay circuit 201b to work in series or in parallel.

The first delay circuit 201a includes a first delay unit 211a and the first switch unit 2021. The second delay circuit 201b includes a second delay unit 211b and the second switch unit 2022. An output end of the first delay unit 211a is connected to a first end of the first switch unit 2021. An input end of the first delay unit 211a is connected to a first end of the second switch unit 2022. An input end of the second delay unit 211b is connected to a second end of the second switch unit 2022. An output end of the second delay unit 211b is connected to a second end of the first switch unit 2021. A first end of the third switch unit 2023 is connected to the output end of the first delay unit 211a. A second end of the third switch unit 2023 is connected to the input end of the second delay unit 211b. The first delay unit 211a and the second delay unit 211b are configured to perform delay processing on the received pulse signal.

The input end of the first delay unit 211a and the first end of the second switch unit 2022 act as the signal input end of the entire circuit to receive the pulse signal. The output end of the second delay unit 211b and the second end of the first switch unit 2021 act as the signal output end to output the pulse signal obtained after delay processing.

As shown in FIG. 3, in some implementations, the first switch unit 2021, the second switch unit 2022, and the third switch unit 2023 each include a third end and a fourth end. Both the third end and the fourth end are connected to the control unit 21, and are configured to receive the control signal transmitted by the control unit 21, control an on/off state of the first switch unit 2021 based on control signals selb1 and sel1, control an on/off state of the second switch unit 2022 based on control signal selb2 and sel2, and control an on/off state of the third switch unit 2023 based on control signals selb3 and sel3.

The first switch unit 2021, the second switch unit 2022, and the third switch unit 2023 are of a same structure.

Exemplarily, the first switch unit 2021 includes a first NMOS transistor and a first PMOS transistor. A source of the first NMOS transistor and a source of the first PMOS transistor are connected to each other, to act as the input end of the first switch unit 2021. A drain of the first NMOS transistor and a drain of the first PMOS transistor are connected to each other, to act as the output end of the first switch unit 2021. Gates of the first NMOS transistor and the first PMOS transistor are connected to the control unit 21 as the third end and the fourth end. The second switch unit 2022 includes a second NMOS transistor and a second PMOS transistor. A source of the second NMOS transistor and a source of the second PMOS transistor are connected to each other, to act as the input end of the second switch unit 2022. A drain of the second NMOS transistor and a drain of the second PMOS transistor are connected to each other, to act as the output end of the second switch unit 2022. Gates of the second NMOS transistor and the second PMOS transistor are connected to the control unit 21 as the third end and the fourth end. The third switch unit 2023 includes a third NMOS transistor and a third PMOS transistor. A source of the third NMOS transistor and a source of the third PMOS transistor are connected to each other, to act as the input end of the third switch unit 2023. A drain of the third NMOS transistor and a drain of the third PMOS transistor are connected to each other, to act as the output end of the third switch unit 2023. Gates of the third NMOS transistor and the third PMOS transistor are connected to the control unit 21 as the third end and the fourth end.

The control signals sent by the control unit 21 to the first switch unit 2021, the second switch unit 2022, and the third switch unit 2023 are voltage signals. Whether voltages of the voltage signals reach threshold voltages of the switch units are determined, so as to control the switch units to or not to be turned on.

The first switch unit 2021 is used as an example for description. A voltage of a voltage signal input to the first switch unit 2021 is set to change within a range of −aV to +aV. When an input voltage of the gate of the first NMOS transistor is the low voltage −aV, that is, sel1=−aV, an input voltage of the gate of the first PMOS transistor is the high voltage +aV, that is, selb1=+aV. Therefore, both the first NMOS transistor and the first PMOS transistor are off, that is, the first switch unit 2021 is off. When an input voltage of the gate of the first NMOS transistor is the high voltage +aV, that is, sel1=+aV, an input voltage of the gate of the first PMOS transistor is the low voltage −aV, that is, selb1=−aV. Therefore, the first NMOS transistor and the first PMOS transistor are on, that is, the first switch unit 2021 is on.

In some implementations, the first delay unit 211a and the second delay unit 211b each include a plurality of phase inverters 2111 connected in series. The plurality of phase inverters 2111 connected in series form two delay chains. It may be understood that a length of the delay chain may be set based on a specific application scenario, and this is not limited herein.

In some implementations, numbers of phase inverters included in the first delay unit 211a and the second delay unit 211b are both even and equal.

Figure 4:
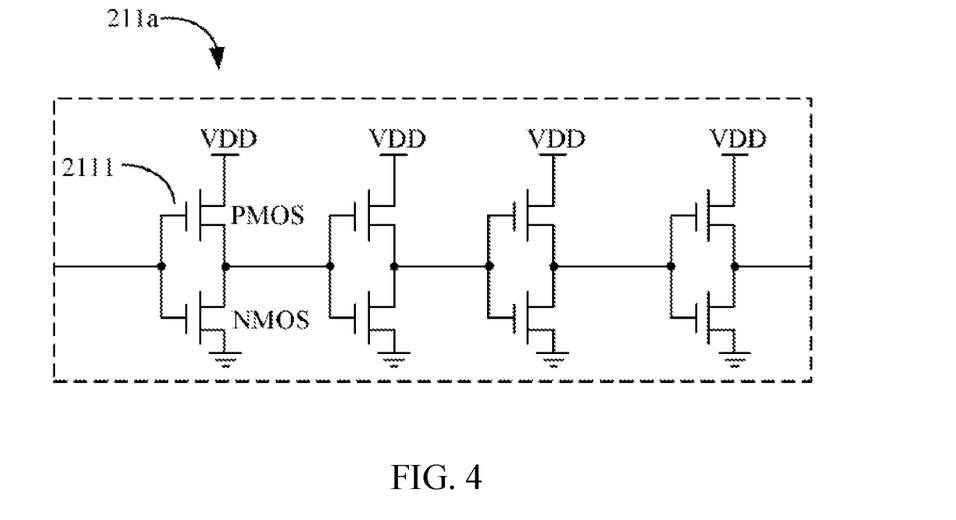
FIG. 4 is a schematic diagram of a structure of a first delay unit in FIG. 3.

Refer to FIG. 4. Specifically, an example in which the delay chain of the first delay unit 211a includes four phase inverters connected in series is used for description. The phase inverter 2111 includes a PMOS transistor and an NMOS transistor. A source of the PMOS transistor is connected to a power supply VDD. A gate of the PMOS transistor and a gate of the NMOS transistor are connected, to act as an input end. A drain of the PMOS transistor and a drain of the NMOS transistor are connected, to act as an output end. A source of the NMOS transistor is connected to a ground terminal.

Generally, the PMOS transistor is used as a load transistor, and the NMOS transistor is used as an input transistor. Such a configuration can greatly reduce power consumption because, in two logic states 0 and 1, one of the two transistors remains off. A threshold voltage of the PMOS transistor is VGS(th)P<0. A threshold voltage of the NMOS transistor is VGS(th)N>0). There is usually made such a requirement that VDD>|VGS(th)P|+VGS(th)N, to ensure normal operation. VDD is a power voltage. If an input is at a low level (for example, 0 V), the PMOS transistor is on, the NMOS transistor is off, and an output voltage approaches VDD: or if an input is at a high level (for example, VDD), the NMOS transistor is on, the PMOS transistor is off, and an output voltage approaches (V.

The phase inverters 2111 connected in series form two delay chains, so as to perform delay processing on pulse signals into to the first delay unit 211a and the second delay unit 211b. The numbers of phase inverters 2111 respectively included in the first delay unit 211a and the second delay unit 211b are even, to ensure that the input pulse signal is the same as the output pulse signal. In addition, when the pulse signal is processed based on a short delay, the two delay chains including a same number of phase inverters 2111 are connected in parallel. In this way, when processing is performed based on the short delay, a driving capability of the delay circuit is improved through parallel connection between the delay chains, so that a process fluctuation of the delay chains is reduced, and appropriate resource utilization effect is achieved.

The process fluctuation is a process deviation of the integrated circuit caused by the fact that a process parameter of a device cannot be accurately controlled in a manufacturing process of the circuit, which affects delay control accuracy of the delay circuit. Therefore, according to the delay circuit provided in the present disclosure, the process fluctuation of the delay circuit is reduced, and the delay control accuracy of the delay circuit is improved.

A working principle of the delay circuit will be described in detail below with reference to the foregoing descriptions about the pulse generation circuit described in this embodiment of the present disclosure and the delay circuit described in this embodiment. For ease of description, an example in which the first delay unit 211a and the second delay unit 211b each include four phase inverters connected in series is used for description.

When the D flip-flop receives a high-level clock pulse, the data of the signal input end is transmitted to the delay circuit as a pulse signal, so that the delay circuit subsequently receives the pulse signal.

When the delay circuit needs to perform first delay processing on the pulse signal, the control unit 21 sends a turn-off signal to the first switch unit 2021 and the second switch unit 2022 to turn off the first switch unit 2021 and the second switch unit 2022, and sends a turn-on signal to the third switch unit 2023 to turn on the third switch unit 2023. In this case, the first delay unit 211a and the second delay unit 211b are connected in series. Therefore, the pulse signal input to the delay circuit is input from the input end of the first delay unit 211a, and is output from the output end of the first delay unit 211a after the first delay unit 211a performs delay processing on the pulse signal. Then, the pulse signal is input to the input end of the second delay unit 211b through the third switch unit 2023, and is output from the output end of the second delay unit 211b after the second delay unit 211b performs delay processing on the pulse signal. In this way, delay processing of the pulse signal is completed. A delay time of the pulse signal in each of the first delay unit 211a and the second delay unit 211b is a seconds. Therefore, a total delay time of the pulse signal in the first delay processing performed by the delay circuit is 2a seconds.

When the delay circuit needs to perform second delay processing on the pulse signal, the control unit 21 sends a turn-on signal to the first switch unit 2021 and the second switch unit 2022 to turn on the first switch unit 2021 and the second switch unit 2022, and sends a turn-off signal to the third switch unit 2023 to turn off the third switch unit 2023. In this case, the first delay unit 211a and the second delay unit 211b are connected in parallel. Therefore, the pulse signal input to the delay circuit is input from the input end of the first delay unit 211a and the first end of the second switch unit 2022, and is output from the second end of the first switch unit 2021 and the output end of the second delay unit 211b after the first delay unit 211a and the second delay unit 211b simultaneously perform delay processing on the pulse signal. A delay time of the pulse signal in each of the first delay unit 211a and the second delay unit 211b is a seconds. Therefore, a total delay time of the pulse signal in the second delay processing performed by the delay circuit is a seconds.

The control unit 21 controls the on/off state of each switch unit to further control a parallel connection or series connection relationship between the delay units, so as to make a delay of the input pulse signal adjustable. In addition, when the input pulse signal is processed based on a short delay, parallel connection of the two delay chains enhances the driving capability of the delay circuit, that is, reduces impact of the process fluctuation. Moreover, appropriate utilization prevents resource waste when a short delay is required.

Figure 5:
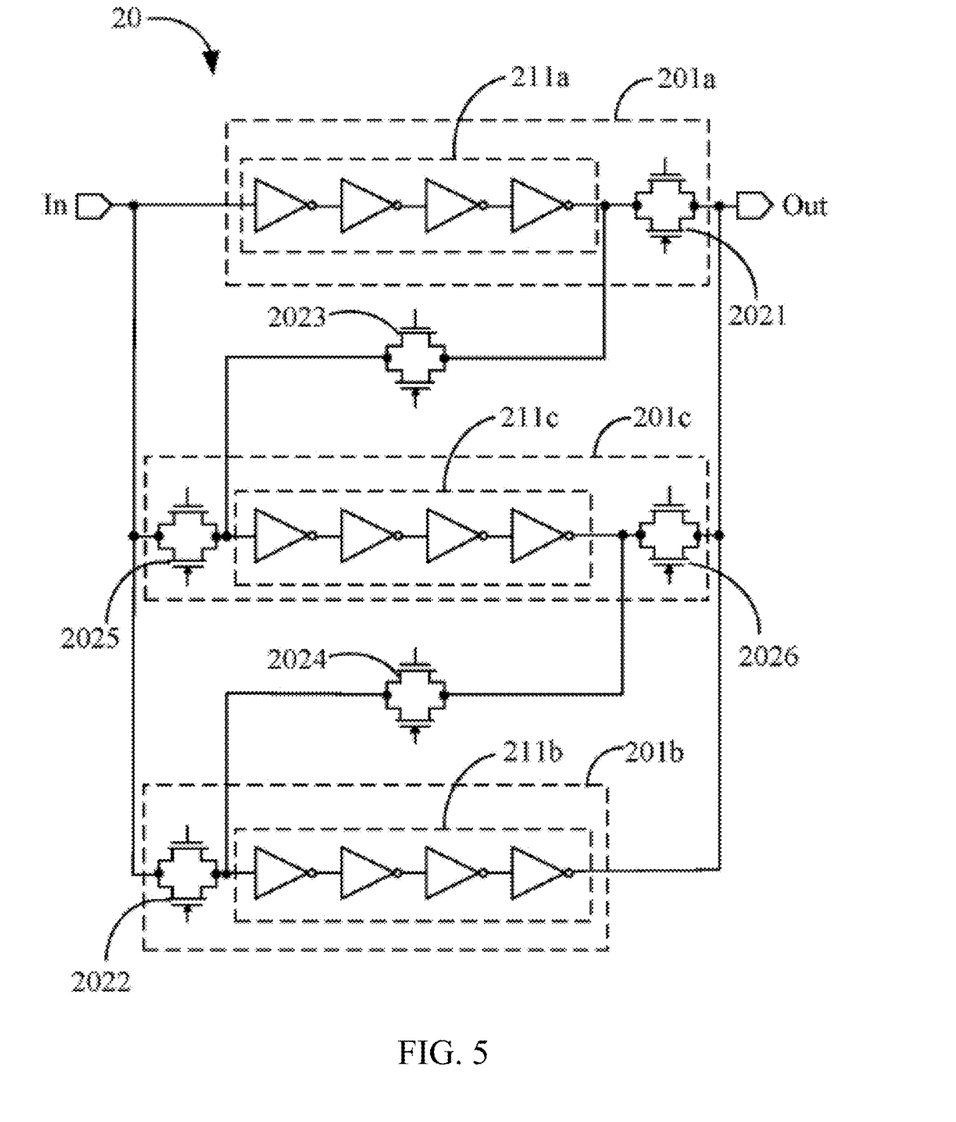
FIG. 5 is a schematic diagram of a structure of a delay circuit according to another embodiment of the present disclosure.

Refer to FIG. 2 and FIG. 5. In some implementations, an example in which the delay circuit 20 includes three delay sub-circuits is used for description.

Specifically, the delay circuit 20 includes a first delay circuit 201a, a second delay circuit 201b, a third delay circuit 201c, and the control unit 21. The first delay circuit 201a, the second delay circuit 201b, and the third delay circuit 201c are connected to each other through a switch module. The switch module includes a first switch unit 2021, a second switch unit 2022, a third switch unit 2023, a fourth switch unit 2024, a fifth switch unit 2025, and a sixth switch unit 2026. The switch module is connected to the control unit 21, so as to receive the control signal sent by the control unit 21, and determine, based on the control signal, whether to be turned on to cause the first delay circuit 201a, the second delay circuit 201b, and the third delay circuit 201c to work in series or in parallel.

The first delay circuit 201a includes a first delay unit 211a and the first switch unit 2021. The second delay circuit 201b includes a second delay unit 211b and the second switch unit 2022. The third delay circuit 201c includes a third delay unit 211c, the fifth switch unit 2025, and the sixth switch unit 2026. An output end of the first delay unit 211a is connected to a first end of the first switch unit 2021. An input end of the first delay unit 211a is connected to a first end of the fifth switch unit 2025 and a first end of the second switch unit 2022. An input end of the third delay unit 211c is connected to a second end of the fifth switch unit 2025. An output end of the third delay unit 211c is connected to a first end of the sixth switch unit 2026. A second end of the sixth switch unit 2026 and an output end of the second delay unit 211b are connected to a second end of the first switch unit 2021. An input end of the second delay unit 211b is connected to a second end of the second switch unit 2022. A first end of the third switch unit 2023 is connected to the output end of the first delay unit 211a. A second end of the third switch unit 2023 is connected to the input end of the third delay unit 211c. A first end of the fourth switch unit 2024 is connected to the output end of the third delay unit 211c. A second end of the fourth switch unit 2024 is connected to the input end of the second delay unit 211b.

The input end of the first delay unit 211a, the first end of the fifth switch unit 2025, and the first end of the second switch unit 2022 act as the signal input end of the entire circuit to receive the pulse signal. The output end of the second delay unit 211b, the second end of the first switch unit 2021, and the second end of the sixth switch unit 2026 act as the signal output end to output the pulse signal obtained after delay processing. The first delay unit 211a, the third delay unit 211c, and the second delay unit 211b are configured to perform delay processing on the received pulse signal.

A working principle of the delay circuit will be described in detail below with reference to the foregoing descriptions about the pulse generation circuit described in this embodiment of the present disclosure and the delay circuit 20 described in this embodiment. For ease of description, an example in which the first delay unit 211a, the second delay unit 211b, and the third delay unit 211c each include four phase inverters connected in series is used for description.

When the D flip-flop receives a high-level clock pulse, the data of the signal input end is transmitted to the delay circuit 20 as a pulse signal, so that the delay circuit 20 subsequently receives the pulse signal.

When the delay circuit 20 needs to perform first delay processing on the pulse signal, the control unit 21 sends a turn-off signal to the first switch unit 2021, the fifth switch unit 2025, the sixth switch unit 2026, and the second switch unit 2022 to turn off the first switch unit 2021, the fifth switch unit 2025, the sixth switch unit 2026, and the second switch unit 2022, and sends a turn-on signal to the third switch unit 2023 and the fourth switch unit 2024 to turn on the third switch unit 2023 and the fourth switch unit 2024. In this case, the first delay unit 211a, the third delay unit 211c, and the second delay unit 211b are connected in series. Therefore, the pulse signal input to the delay circuit is input from the input end of the first delay unit 211a, and is output from the output end of the first delay unit 211a after the first delay unit 211a performs delay processing on the pulse signal. Then, the pulse signal is input to the input end of the third delay unit 211c through the third switch unit 2023, and is further output from the output end of the third delay unit 211c after the third delay unit 211c performs delay processing on the pulse signal. Finally, the pulse signal is input to the input end of the second delay unit 211b through the fourth switch unit 2024, and is further output from the output end of the second delay unit 211b after the second delay unit 211b performs delay processing on the pulse signal. In this way, delay processing of the pulse signal is completed. A delay time of the pulse signal in each of the first delay unit 211a, the third delay unit 211c, and the second delay unit 211b is a seconds. Therefore, a total delay time of the pulse signal in the first delay processing performed by the delay circuit 20 is 3a seconds.

When the delay circuit 20 needs to perform second delay processing on the pulse signal, the control unit 21 sends a turn-off signal to the first switch unit 2021, the fifth switch unit 2025, the second switch unit 2022, and the fourth switch unit 2024 to turn off the first switch unit 2021, the fifth switch unit 2025, the second switch unit 2022, and the fourth switch unit 2024, and sends a turn-on signal to the sixth switch unit 2026 and the third switch unit 2023 to turn on the sixth switch unit 2026 and the third switch unit 2023. In this case, the first delay unit 211a and the third delay unit 211c are connected in series, and the second delay unit 211b is off. Therefore, the pulse signal input to the delay circuit 20 is input from the input end of the first delay unit 211a, and is output from the output end of the first delay unit 211a after the first delay unit 211a performs delay processing on the pulse signal. Then, the pulse signal is input to the input end of the third delay unit 211c through the third switch unit 2023, and is further output from the output end of the second delay unit 211c after the third delay unit 211c performs delay processing on the pulse signal. In this way, delay processing of the pulse signal is completed. A delay time of the pulse signal in each of the first delay unit 211a and the third delay unit 211c is a seconds. Therefore, a total delay time of the pulse signal in the second delay processing performed by the delay circuit 20 is 2a seconds.

Alternatively, the control unit 21 may control the first switch unit 2021, the second switch unit 2022, the third switch unit 2023, and the sixth switch unit 2026 to be turned off, and control the fifth switch unit 2025 and the fourth switch unit 2024 to be turned on, so that the input pulse signal sequentially passes through the third delay unit 211c and the second delay unit 211b. In this way, a total delay time of the pulse signal may also be 2a seconds. Therefore, it may be understood that the control unit 21 controls a status of each switch unit to change a transmission path of the pulse signal on the delay circuit, to make the delay of the pulse signal adjustable.

When the delay circuit 20 needs to perform third delay processing on the pulse signal, the control unit 21 sends a turn-on signal to the first switch unit 2021, the fifth switch unit 2025, the sixth switch unit 2026, and the second switch unit 2022 to turn on the first switch unit 2021, the fifth switch unit 2025, the sixth switch unit 2026, and the second switch unit 2022, and sends a turn-off signal to the third switch unit 2023 and the fourth switch unit 2024 to turn off the third switch unit 2023 and the fourth switch unit 2024. In this case, the first delay unit 211a, the third delay unit 211c, and the second delay unit 211b are connected in parallel. Therefore, the pulse signal input to the delay circuit is input from the input end of the first delay unit 211a, the first end of the fifth switch unit 2025, and the first end of the second switch unit 2022, and is output from the second end of the first switch unit 2021, the second end of the sixth switch unit 2026, and the output end of the second delay unit 211b after the first delay unit 211a, the third delay unit 211c, and the second delay unit 211b simultaneously perform delay processing on the pulse signal. In this way, delay processing of the pulse signal is completed. A delay time of the pulse signal in each of the first delay unit 211a, the third delay unit 211c, and the second delay unit 211b is a seconds. Therefore, a total delay time of the pulse signal in the third delay processing performed by the delay circuit 20 is a seconds.

The control unit 21 controls the on/off state of each switch unit to further control a parallel connection or series connection relationship between the delay units, so as to make a delay of the input pulse signal adjustable. In addition, when the input pulse signal is processed based on a short delay, parallel connection of delay chains enhances the driving capability of the delay circuit, that is, reduces impact of the process fluctuation. Moreover, appropriate utilization prevents resource waste when a short delay is required.

Figure 6:
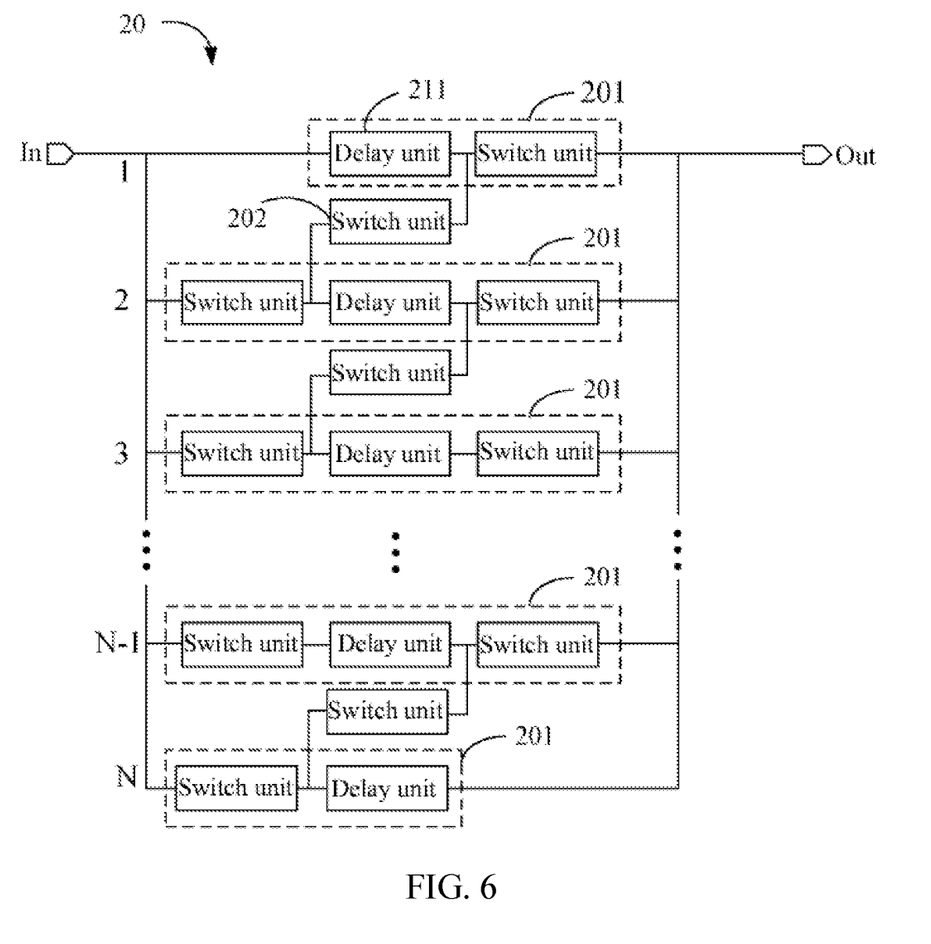
FIG. 6 is a schematic diagram of a structure of a delay circuit according to still another embodiment of the present disclosure.

Refer to FIG. 2 and FIG. 6. In some implementations, an example in which the delay circuit 20 includes N delay sub-circuits is used for description. N is a positive integer greater than or equal to 4.

Specifically, the delay circuit 20 includes the control unit 21 and N delay sub-circuits 201. The delay sub-circuit 201 is configured to perform delay processing on the input pulse signal. The control unit 21 is configured to control a connection relationship between the delay sub-circuits 201.

In some implementations, each delay sub-circuit 201 includes at least one delay unit 211 and at least one switch unit. The delay unit 211 is configured to perform delay processing on the input pulse signal. The switch unit is configured to control the delay sub-circuit 201 to be connected or not.

Two adjacent delay sub-circuits 201 are connected through a switch module. The switch module is connected to the control unit 21, so that the switch module is controlled by the control unit 21 to be turned on or off, to cause the delay sub-circuits 201 to work in series or in parallel.

Exemplarily, as shown in FIG. 6, the switch module includes N switch units 202. Each delay sub-circuit 201 is provided with a delay unit 211. The delay unit 211 is connected to at least one of the signal input end or the signal output end through the switch unit 202 of the switch module. The delay units 211 of adjacent delay sub-circuits 201 are connected through the switch unit 202. An input end of a first delay sub-circuit 201 is connected to the signal input end. An output end of an $N^{th}$ delay sub-circuit 201 is connected to the signal output end.

When adjacent delay sub-circuits 201 need to work in parallel, the control unit 21 controls a switch unit between the adjacent delay sub-circuits 201 to be turned off, and controls switch units between the corresponding delay sub-circuits 201 and the signal input end or the signal output end to be turned on.

When adjacent delay sub-circuits 201 need to work in series, the control unit 21 controls a switch unit between the adjacent delay sub-circuits 201 to be turned on, and controls switch units between the corresponding delay sub-circuits 201 and the signal input end or the signal output end to be turned off.

The control unit 21 controls the on/off state of each switch unit to further control a parallel connection or series connection relationship between the delay units, so as to make a delay of the input pulse signal adjustable. In addition, when the input pulse signal is processed based on a short delay, parallel connection of delay chains enhances the driving capability of the delay circuit, that is, reduces impact of the process fluctuation. Moreover, appropriate utilization prevents resource waste when a short delay is required.

The present disclosure further provides a chip. The chip includes the pulse generation circuit described in any one of the foregoing embodiments of the present disclosure.

Therefore, a corresponding and specific implementation of the chip in this embodiment of the present disclosure is similar to a specific implementation of the pulse generation circuit in the embodiments of the present disclosure. For details, reference is made to descriptions of the pulse generation circuit. Details are not described herein again.

The present disclosure further provides a server. The server is configured to perform data processing or computation, for example, perform computation for mining virtual digital currency. The server includes a connection board, a control board, a heat sink, a power board, and one or more hash boards. Each hash board includes one or more chips. The control board is connected to the hash board through the connection board. The heat sink is disposed around the hash board. The power board is configured to provide power for the connection board, the control board, the heat sink, and the hash board.

It should be understood that the term "and/or" used in this specification and the appended claims of the present disclosure indicates any combination and all possible combinations of one or more items listed in association, and includes the combinations. It should be noted that the term "comprise", "include", or any other variant thereof herein is intended to encompass a non-exclusive inclusion, such that a process, method, article, or system that includes a series of elements not only includes those elements, but also includes other elements not explicitly listed, or elements that are inherent to such a process, method, article, or system. In the absence of more restrictions, an element defined by "including a . . . " does not exclude another same element in a process, method, article, or system that includes the element.

The serial numbers of the foregoing embodiments of the present disclosure are only for description, and do not represent the superiority or inferiority of the embodiments. The foregoing descriptions are merely specific embodiments of the present disclosure, but are not intended to limit the protection scope of the present disclosure. Any equivalent modification or replacement readily figured out by those skilled in the art within the technical scope disclosed in the present disclosure shall fall within the protection scope of the present disclosure. Therefore, the protection scope of the present disclosure shall be subject to the protection scope of the claims.

The invention claimed is:

1. A pulse generation circuit, comprising a flip-flop and a delay circuit, wherein
an input end of the flip-flop is connected to a signal source, an output end of the flip-flop is connected to an input end of the delay circuit, and the flip-flop is configured to output a corresponding pulse signal based on a signal sent by the signal source; and
the delay circuit is configured to perform delay processing on an input pulse signal and comprises:
a control unit and at least two delay sub-circuits, wherein each delay sub-circuit comprises a delay unit and a switch unit, the delay unit is configured to perform delay processing on the input pulse signal, and the switch unit is configured to control the delay sub-circuit to or not to be connected; input ends of the delay sub-circuits are connected to each other, and are configured to receive the pulse signal; output ends of the delay sub-circuits are connected to each other, and are configured to output a delayed pulse signal; and in any two adjacent delay sub-circuits of the delay sub-circuits, an output end of a delay unit of one delay sub-circuit is connected to an input end of a delay unit of the other delay sub-circuit through a switch unit; and
the control unit is connected to all the switch units, and is configured to separately control a plurality of switch units to be turned on or off, so as to perform corresponding delay processing on the pulse signal;

wherein the flip-flop is a Data flip-flop (D flip-flop), a signal input end of the D flip-flop is connected to the signal source, a clock input end of the D flip-flop is configured to receive a clock pulse, and a signal output end of the D flip-flop is connected to the input end of the delay circuit, and a clear signal end of the D flip-flop is connected to an output end of the delay circuit.

2. A chip, wherein the chip is integrated with a pulse generation circuit according to claim 1.

3. A server, comprising a plurality of chips according to claim 2.

4. The delay circuit according to claim 1, wherein the delay sub-circuits comprise a first delay circuit and a second delay circuit, the first delay circuit comprises a first delay unit and a first switch unit, and the second delay circuit comprises a second delay unit and a second switch unit;

an output end of the first delay unit is connected to a first end of the first switch unit, an input end of the first delay unit is connected to a first end of the second switch unit, an input end of the second delay unit is connected to a second end of the second switch unit, and an output end of the second delay unit is connected to a second end of the first switch unit;

a first end of a third switch unit is connected to the output end of the first delay unit, and a second end of the third switch unit is connected to the input end of the second delay unit; and the control unit is connected to the first switch unit, the second switch unit, and the third switch unit, and is configured to control the first switch unit, the second switch unit, and the third switch unit to be turned on or off, so as to perform corresponding delay processing on the pulse signal.

5. The delay circuit according to claim 4, wherein, with respect to that the control unit is configured to control the first switch unit, the second switch unit, and the third switch unit to be turned on or off, so as to perform corresponding delay processing on the pulse signal, the control unit is further configured to:

send a corresponding control signal to the first switch unit, the second switch unit, and the third switch unit; and wherein, when the control signal is for controlling the first switch unit and the second switch unit to be turned off and controlling the third switch unit to be turned on, the first delay unit is connected to the second delay unit in series, and the input pulse signal sequentially passes through the first delay unit and the second delay unit, so that a pulse signal delayed for a first delay time is output; or when the control signal is for controlling the first switch unit and the second switch unit to be turned on and controlling the third switch unit to be turned off, the first delay unit is connected to the second delay unit in parallel, and the input pulse signal simultaneously passes through the first delay unit and the second delay unit, so that a pulse signal delayed for a second delay time is output, wherein the first delay time is greater than the second delay time.

6. The delay circuit according to claim 4, wherein the first delay unit and the second delay unit each comprise a plurality of phase inverters connected in series; and numbers of phase inverters comprised in the first delay unit and the second delay unit are equal and both even.

7. The delay circuit according to claim 6, wherein the phase inverter comprises a Positive channel Metal Oxide Semiconductor (PMOS) transistor and a Negative channel-Metal-Oxide-Semiconductor (NMOS) transistor; a source of the PMOS transistor is connected to a power supply; a gate of the PMOS transistor and a gate of the NMOS transistor are connected, to act as an input end; a drain of the PMOS transistor and a drain of the NMOS transistor are connected, to act as an output end; and a source of the NMOS transistor is connected to a ground terminal.

8. The delay circuit according to claim 4, wherein the first switch unit, the second switch unit, and the third switch unit each comprise a third end and a fourth end; and both the third end and the fourth end are connected to the control unit, and are configured to receive a control signal transmitted by the control unit, to control statuses of the first switch unit, the second switch unit, and the third switch unit based on the control signal, so that the delay circuit outputs a pulse signal delayed for a corresponding delay time.

* * * * *